United States Patent [19]
Cher et al.

[11] Patent Number: 5,453,156
[45] Date of Patent: Sep. 26, 1995

[54] ANISOTROPIC POLYSILICON PLASMA ETCH USING FLUORINE GASES

[75] Inventors: Ming-Shry Cher; Chung-Hsing Shan, both of Hsin-Chu, Taiwan, Prov. of China

[73] Assignee: Taiwan Semiconductor Manufactoring Company Ltd., Hsinchu, Taiwan, Prov. of China

[21] Appl. No.: 332,907

[22] Filed: Nov. 1, 1994

[51] Int. Cl.$^6$ ................................................ H01L 21/00
[52] U.S. Cl. .................... 156/643.1; 156/646.1; 156/651.1; 156/662.1
[58] Field of Search .............. 156/651.1, 646.1, 156/643.1, 662.1

[56] References Cited

U.S. PATENT DOCUMENTS

| | | | |
|---|---|---|---|
| 4,255,230 | 3/1981 | Zajac | 156/646.1 X |
| 4,426,246 | 1/1984 | Kravitz et al. | 156/643.1 |
| 4,502,915 | 3/1985 | Carter et al. | 156/643.1 |
| 4,808,259 | 2/1989 | Jillie, Jr. et al. | 156/643 |
| 5,180,464 | 1/1993 | Tatsumi et al. | 156/626 |
| 5,188,980 | 2/1993 | Lai | 437/193 |
| 5,242,536 | 9/1993 | Schoenborn | 156/643 |
| 5,296,095 | 3/1994 | Nabeshima et al. | 156/662 |
| 5,336,365 | 8/1994 | Goda et al. | 156/643.1 |

OTHER PUBLICATIONS

VLSI Technology, Second Edition by SiMsze, McGraw–Hill International Editions, New York, N.Y. ©1988, pp. 200–204.

Primary Examiner—Thi Dang
Attorney, Agent, or Firm—George O. Saile

[57] ABSTRACT

A process for dry etching a polysilicon layer or gate structure of an integrated circuit is achieved. More particularly, a process for overetching a polysilicon layer using, in place of a conventional chloride gas (e.g., $CCl_4$), a fluorine gas, such as $C_2F_6$ or $CF_4$ is disclosed. After the main etch step, a passivation formation step is performed where a mixture of helium and fluorine gases is flowed into a plasma etch chamber. Next, an overetch is performed by flowing a mixture of helium and chlorine gas. This process eliminates the need to use $CCl_4$ or other harmful ozone containing gases in the overetch step. Moreover, an acceptable polysilicon sidewall profile is achieved and no undercutting of the polysilicon layer is experienced using this process.

24 Claims, 3 Drawing Sheets

ANISOTROPIC POLYSILICON PLASMA ETCH USING FLUORINE GASES

BACKGROUND OF THE INVENTION

1) Field of the Invention

This invention relates to a method of dry etching a polysilicon layer formed on a silicon oxide layer of a semiconductor device and more particularly, to the selection of etching gases for etching a polysilicon film on a silicon oxide layer on a silicon substrate with a gas plasma.

2) Description of the Prior Art

Plasma etch processes and apparatus are generally well known for etching materials for semiconductor device fabrication. The process begins with an application of a masking material, such as photoresist, to a silicon wafer. The masking pattern protects area of the wafer from the etch process. The wafer is then placed in a plasma reactor (i.e., etcher) and etched. Subsequent steps are determined by the type of device being fabricated.

A common silicon etch process is based on fluorine. When mixtures such as $CF_4$—$O_2$ are dissociated in an electrical discharge, fluorine atoms are liberated and volatilize the silicon as $SiF_4$. Nevertheless, these processes are isotropic, i.e., they etch in all directions at the same rate. Moreover, anisotropic or vertical etches in silicon are not observed when fluorine is the sole etchant.

For vertical (anisotropic) etches of silicon, the use of gas mixtures, such as $C_2F_6$—$Cl_2$, is known. The $C_2F_6$ serves as a source of "recombinants", such as $C_3$. The recombinants suppress lateral etching (in the horizontal direction) by recombining with Cl atoms which have been adsorbed on the etched polysilicon sidewalls. Etching can proceed in the vertical direction (perpendicular to the wafer surface) because ion bombardment from the plasma suppresses the recombination mechanism.

Further, the selectivity of etch between polysilicon and an underlying gate oxide (poly:oxide selectivity) must be as high as possible minimize oxide loss. These two requirements, anisotropy and poly: oxide selectivity, could previously only be fulfilled with chlorine-based dry etching processes, as opposed to fluorine-containing plasmas that tend to etch isotropically and have poor selectivity of poly:oxide.

In addition to an etch step, most conventional processes include an overetch step. Overetching is necessary in order to ensure that no residues are left on the wafer. If etching was stopped at the "end point", as determined by optical emission from the plasma, only parts of the wafer would be completely etched while other parts would still be covered with remaining polysilicon. This is due to non-uniformity of both the initial polysilicon film thickness and the etch rate.

Moreover, most of the current polysilicon dry processes use an overetch gas containing chloride, especially $CCl_4$, which is harmful to the environment as an ozone destroying chemical.

FIG. 1 illustrates an acceptable polysilicon etch profile. Substrate 10 is covered by gate oxide 12, polysilicon gate 14, native oxide 17, and photoresist 18. The polysilicon gate 14 sidewall 16 is vertical; it is not "undercut" 15 as shown in FIG. 2, or does not have a "foot" 20 at the poly gate 14 base displayed in FIG. 3. Both undercutting and foot forming processes result from complicated etch (isotropic and anisotropic) and deposition reactions. For example, the undercutting can result from fast (enhanced) isotropic etching near the bottom of the layer. Foot formation can be caused by redeposition, which can have a higher rate at the bottom of a small etching region.

Today's submicron polysilicon (poly) gate patterning requires minimum etch bias and vertical polysilicon sidewall profiles (anisotropy). The etch process should not undercut the mask, and the poly line should not be narrower at the polyoxide interface than it is at the poly-mask interface.

To ensure the etch in commercial plasma mode polysilicon etchers do not create an undercut in the profile, Carbon tetrachloride ($CCl_4$) is often used to form a polymer on the polysilicon sidewall which protects the sidewall from undercutting etch processes during the overetch step. If $CCl_4$ is absent in the overetch step, the undercut is inevitable as shown in FIG. 2. Moreover, the greater the polysilicon gate undercut, the greater the failure rate of the VLSI MOS devices. Sidewall passivation effect during etching is described by S. Sze in his book, *VLSI Technology*, Second Edition, McGraw-Hill international Editions, New York, N.Y. c. 1988, p.200–204.

In a common industry practice performed to prevent "foot" formation on polysilicon gates, an overetch step including $CCl_4$ is performed after the main etch step. The overetch consumes the foot as well as any residual polysilicon on the oxide surface. A typical process which is widely used for polysilicon etch in an AUTOETCH-490 LAM RESEARCH CORPORATION is:

TABLE 1

Conventional $CCl_4$ Polysilicon Etch Process For an AUTOETCH-490

| STEP | Pressure mTorr | Power W | Spacing cm | Flow rate/Gas sccm | Time sec |
|---|---|---|---|---|---|
| Break Through | 600 | 325 | 0.45 | 150/He - 175/$C_2F_6$ | 20 |
| Main Etch | 375 | 223 | 0.45 | 200/HE - 80/$Cl_2$ | 40 to 50 |
| Overetch | 375 | 223 | 0.45 | 200/HE - 80/$Cl_2$ - 30/$CCl_4$ | 30 |

In order to produce polysilicon gates of proper dimensions using dry etch processes, it is necessary to form a deposit on the etching (polysilicon) side wall to protect the etching sidewall from ions and/or radicals in a plasma which can etch (laterally) the sidewall. The $CCl_4$ gas in the conventional overetch step is used to form a polymer which protects the polysilicon sidewall 16 from undercut during the overetch step. If the overetch step is performed without a C containing reactant, no polymer is formed, and undercutting (15) results as shown in FIG. 2.

While the conventional $CCl_4$ overetch step yields satisfactory polysilicon profiles, the $CCl_4$ is an ozone destroying, CFC material. Because of the great environmental damage caused by chloride containing chemicals and worldwide government regulation of CFC emissions, there is a need to develop an overetch process that does not use a chloride reactant in the overetch step, but still yields satisfactory polysilicon etch profiles.

The following terms and abbreviations are or may be used herein: Polysilicon (poly); Carbon (C); Chlorine ($Cl_2$); Helium (He); Hydrogen (H); milli Torr (mT or mTorr); standard cubic centimeters per minute (sccm); Angstroms (Å); microns (μm); watts (w); kilowatts (kW); Celsius (° C.); etch rate (ER); seconds (sec); minutes (min.); hours (hr); less than (<); greater than (>); percent (%); ratio of one element "X" to another element "Y" (X:Y); fluoride is a compound of fluorine (F); and chloride is a compound of chlorine (Cl).

U.S. Pat. No. 5,296,095 to Nabeshhima et al. teaches a process for etching silicon oxide using a principle etching gas and an additive gas—the etching gas compound contains a C element or an S element or a Cl element together with an F element (such as $CF_4$), and the additive gas compound contains a C element and two or more H elements (such as $CH_2F_2$, $CHF_3$ or $CH_3Br$).

U.S. Pat. No. 4,808,259 to Jillie, Jr. et al. teaches a method for etching of MOS devices ($SiO_2$, $Si_3N_4$, and oxynitride (ONO) utilizing a multi-step power reduction plasma etching recipe to reduce ion bombardment damage on the resulting surface.

U.S. Pat. No. 5,180,464 to Tatsumi et al. teaches a dry etch method to etch a polycide film using an etching gas containing a fluorine gas mixed with at least HBr.

U.S. Pat. No. 5,188,980 to Lai teaches a process for dry etching a multilayer tungsten silicide gate structure where three steps are used: 1) a plasma etch using a mixture of chlorine and helium gases, 2) a helium purge, and 3) an final etch using chlorine and helium gases. This processes aims to reduce undercutting of the polycide layer.

U.S. Pat. No. 5,242,536 to Schoenborn discloses an anisotropic polysilicon etch process using $Cl_2$/HBr/He. The use of HBr allows operation under high poly: oxide selectivity conditions that would otherwise produce lateral etching of poly under the photoresist mask isotropy). The selectivity poly:resist ratio is increased by including HBr. The use of HBr appears to enhance poly sidewall passivation without relying on resist redeposition. In contrast thereto, in the present invention HBr is not used. In the present invention, a fluoride containing gas such as $C_2F_6$ is used in a passivation step, prior to the overetch step to suppress sidewall undercutting.

The patents described above do not resolve the problem of providing acceptable polysilicon profiles without using $CCl_4$ in the overetch step. Neither do they solve the limitation that etching tends to become more isotropic during overetch, when the underlying oxide is exposed, resulting in undercutting. Furthermore, more accurate polysilicon profiles are desirable.

SUMMARY OF THE INVENTION

It is an object of this invention to provide a polysilicon etching process that produces improved polysilicon sidewall profiles.

It is a further object of this invention to substitute carbon hexafluoride ($C_2F_6$) for carbon tetrachloride ($CCl_4$) in the overetch process to protect the environment while at the same time improving the polysilicon sidewall profiling.

A process for dry etching a polysilicon layer or gate structure of an integrated circuit is presented. More particularly, a process for overetching a polysilicon layer using, in place of a conventional chloride gas (e.g., $CCl_4$), a fluorine gas, such as $C_2F_6$ or $CF_4$ is disclosed. After the main etch step, a passivation formation step is performed where a mixture of helium and fluorine gases is flowed into a plasma etch chamber. Next, an overetch step is performed by flowing a mixture of helium (He) and chlorine ($Cl_2$) gas. This process eliminates the need to use $CCl_4$ or other harmful ozone destroying gases in the overetch step. Moreover, an acceptable polysilicon sidewall profile is achieved and minimal undercutting of the polysilicon layer is experienced using this process.

DETAILED DESCRIPTION OF THE PREFERRED EMBODIMENTS

According to the present invention, a dry etch process is disclosed for anisotropic polysilicon etching using a four step process: 1) a break through step using He and $C_2F_6$, 2) a main etch step using He and $Cl_2$, 3) a passivation step using a mixture of He and a gas containing fluoride ($F^-$) such as $C_2F_6$, and 4) an overetch step using He and $Cl_2$.

In the material below, results were obtained on the LAM 490 (trademark) Etcher available from LAM Research Corp. of Fremont, Calif., but the invention is not limited to the use of this particular etcher. Flow rates, powers, spacings, times and other process variables may be normalized to work with other etchers and on other size and type wafers. The LAM 490 etcher is a parallel plate etcher having 8 inch parallel anodized aluminum electrodes spaced apart by a measured distance (referred to as the spacing). The top electrode (cathode) is powered by a 1250 watt generator. The bottom electrode (anode) is grounded.

Figure 4:
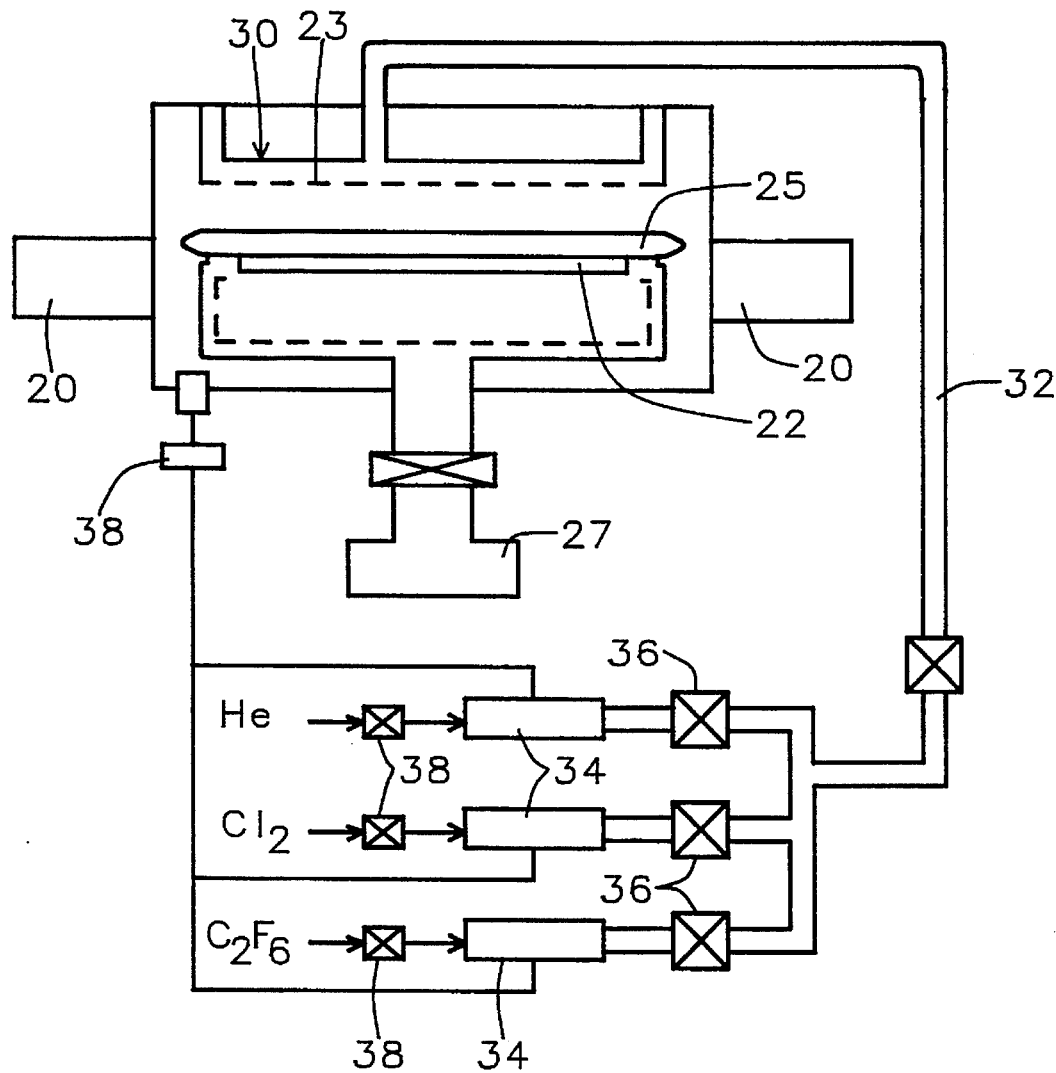
FIG. 4 schematically illustrates a view of the vacuum chamber and gas flow system.

Now referring to FIG. 4, there is shown a schematic of a typical etcher. The wafer to be etched 25 is placed between the lower and upper electrodes, 22 and 23 respectively. The Load/Lock mechanism 20 provide for automatic insertion and removal of the wafer 25. A vacuum is provided by the vacuum pump 27. The temperature inside the chamber is maintained at approximately 120° C. during plasma-on operation of the process. The gap (spacing) between the lower and upper electrodes 22 and 23 varies by the process step. Gases flow into the chamber through the gas feed 32. Valves 36 turn gas flow on and off. Valves 34 are the mass flow controllers (MFC) that are used to adjust the gas flow according to electronic signals from a process control computer.

In the process of the current invention, (see infra Table 2 for a summary of the process) the flow rates for the first step, the breakthrough step, is 150 sccm ±5 sccm of Helium and 175 sccm ±5 sccm of $C_2F_6$. A suitable radio frequency with a power of about 325 W is applied. The radio frequency generator is not shown on the drawing. The radio frequency power from the generator is applied to the plasma etching equipment at 30. This first step lasts for 25 seconds ±5 sec. The space between the electrodes is approximately 0.45 cm while the chamber pressure is maintained at approximately 600 mT. The purpose of this break though step is used to etch through the thin native oxide 17 formed on the polysilicon layer 14 (see FIG. 1 ).

The second step, is the main etch step. The flow rates for the main etch step, are 70 sccm ±5 sccm of helium and 130 sccm ±5 sccm of $Cl_2$. A suitable radio frequency with a power of about 200 W is applied. This step lasts for 30 seconds ±10 seconds. The space between the electrodes is approximately 0.5 cm while the chamber pressure is maintained at approximately 200 mT. The endpoint detector 38 determines the end of this process step by sensing when the underlying silicon oxide 12 is sufficiently exposed.

The novel third step, is the passivation formation step. The flow rates for the passivation formation step are 100 sccm ±5 sccm of Helium and 100 sccm ±5 sccm of a gas containing fluorine (e.g., $C_2F_6$). Any suitable gas containing fluorine can be used, such as $CF_4$ or $C_2F_6$. A suitable radio frequency with a power of about 225 W is applied. This step lasts for 5 seconds ±2 seconds. The space between the electrodes is approximately 0.8 cm while the chamber pressure is maintained at approximately 900 mT. This passivation formation step using $C_2F_6$ serves to prevent polysilicon sidewall undercutting. This $C_2F_6$ passivation process replaces the conventional $CCl_4$ overetch process which inhibits sidewall overetch by forming a Cl residue polymer on the sidewall.

Figure 1:
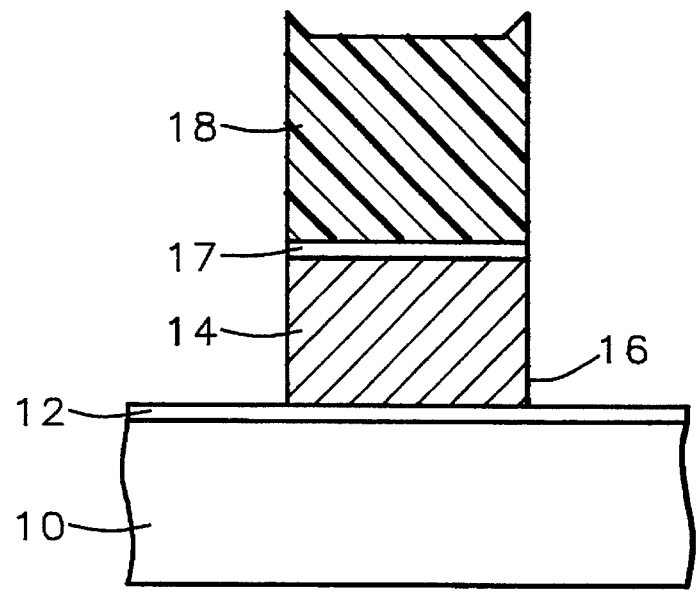
FIG. 1 schematically illustrates in cross-sectional representation of an acceptable polysilicon etch profile.
Figure 2:
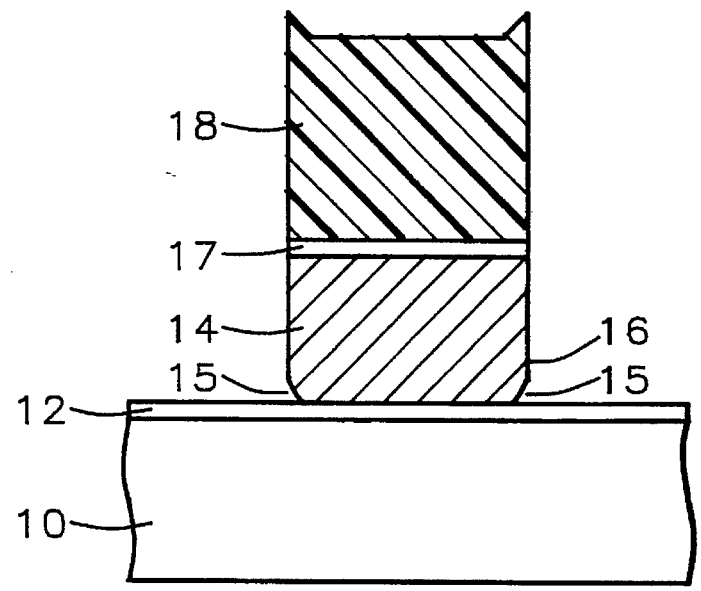
FIG. 2 schematically illustrates in cross-sectional representation of an unacceptable polysilicon etch profile having undercutting.
Figure 3:
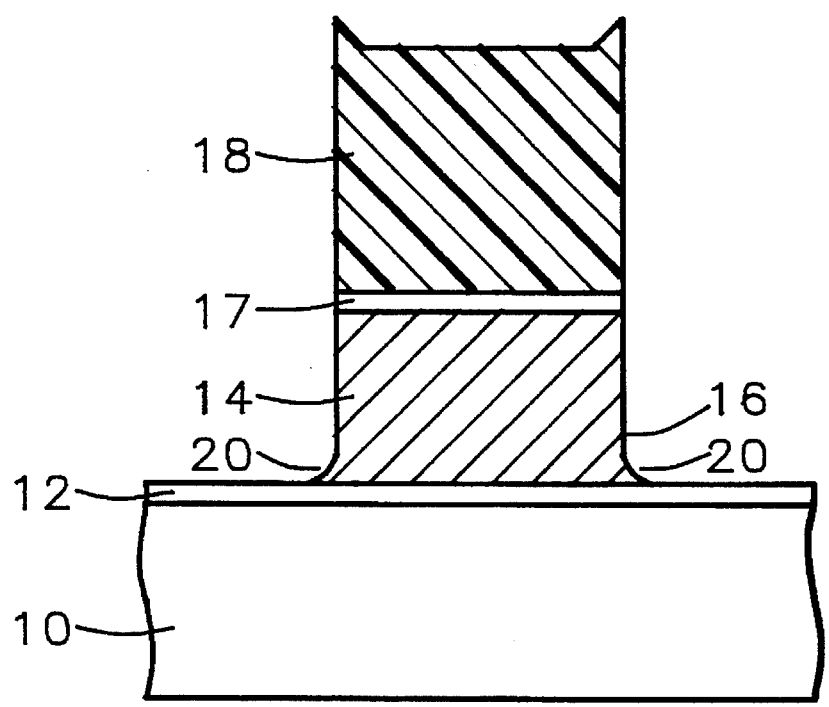
FIG. 3 schematically illustrates in cross-sectional representation of an unacceptable polysilicon etch profile having a "foot."

In the fourth step of the process, the overetch step, the gas flow rates are 70 sccm ±5 sccm of Helium and 130 sccm ±5 sccm of $Cl_2$. A suitable radio frequency with a power of about 200 W is applied. This step lasts for 20 seconds ±5 seconds. The space between the electrodes is approximately 0.5 cm while the chamber pressure is maintained at approximately 200 mT (milli-torr). This application of helium and chlorine gases acts as the etch the remaining polysilicon layer 14 over the silicon oxide layer 12 and etches the foot 20 so that an acceptable polysilicon profiles results as shown in FIG. 1. Silicon oxide layer 12 has a thickness preferably greater than 100 Å since the approximately 100 Å of oxide can be removed during this etch process and the post clean.

Table 2 below summarizes the process variables for the polysilicon etch process of the invention:

TABLE 2

Process of the Invention- Polysilicon Dry Etch

| STEP | Pressure mTorr | Power W | Spacing cm | Flow rate/Gas sccm | Time sec |
|---|---|---|---|---|---|
| Break Through | 600 | 325 | 0.45 | 150/He - 175/$C_2F_6$ | 25 |
| Main Etch | 200 | 200 | 0.5 | 70/He - 130/$Cl_2$ | 30 |
| Passivation | 900 | 225 | 0.8 | 100/HE - 100 $C_2F_6$ | 5 |
| Overetch | 200 | 200 | 0.5 | 70/He - 130/$Cl_2$ | 20 |

The wafer 25 is removed from the etching apparatus. The photoresist layer 18 is removed by conventional resist stripping techniques, such as by oxygen dry ashing. Any sidewall deposits are removed using preferably a HF dip in approximately 1% HF in $H_2O$ for approximately 20 seconds. The etching and patterning of the polysilicon layer can be used to form a polysilicon gate or any other suitable polysilicon structure, (e.g., polysilicon lines, etc.).

In the process of the invention, a Cl radical is formed from the He +$Cl_2$ etch gases in the main etch step and the Cl radical is deposited on the polysilicon sidewall. In addition, the $C_2F_6$ from the $C_2F_6$ passivation step produces a F radical in the plasma. During the passivation step, the F radical replaces the Cl radical on the polysilicon sidewall. Next, the F radial protects the poly profile during the poly overetch step since Cl radicals from the $Cl_2$ overetch step can not replace the F radical on the poly sidewall. This prevents the Cl radical from etching and undercutting the poly sidewall in the overetch step. Therefore, the F radical forms a protective layer to prevent the Cl radicals from inducing poly isotropic etching during the He +$Cl_2$ overetch step.

The process of the current invention is a process for overetching a polysilicon layer using, in place of a conventional chloride gas (e.g., $CCl_4$), a fluorine gas, such as $C_2F_6$ or $CF_4$. This process eliminates the need to use $CCl_4$ or other harmful ozone containing gases in the overetch step. Moreover, an acceptable polysilicon sidewall profile is achieved and no undercutting of the polysilicon layer is experienced using this process.

The new passivation step using $C_2F_6$ forms a F radical which successfully replaces the Cl radical from the main etch step and forms a passivation layer to prevent the additional production of Cl radical during the overetch step. Moreover, with the new process, the process chamber polymer buildup is reduced compared to the traditional $Cl_2$ +He +$Cl_4$ poly etch process thus reducing hardware maintenance. Most importantly, this process minimizes the ozone destroying CFC's produced by eliminating $CCl_4$ from the overetch step, so this invention is important in protecting the environment.

While the invention has been particularly shown and described with reference to the preferred embodiments thereof, it will be understood by those skilled in the art that various changes in form and details may be made without departing from the spirit and scope of the invention.

What is claimed is:

1. The process of etching a polysilicon gate on a suitable substrate through a patterned resist layer which will not undercut the polysilicon layer which process comprises:

etching said polysilicon layer with a first flow of helium and fluorine containing gases into a plasma reactive etching chamber containing said semiconductor substrate;

etching said polysilicon layer with a second flow of helium and chlorine gases into the plasma reactive etching chamber containing said semiconductor substrate;

detecting the endpoint of the completion of etching of the polysilicon layer and stopping the flow of said chlorine gas;

etching said polysilicon layer with a third flow of mixture of fluorine containing gas and helium gases into the plasma reactive etching chamber containing said semiconductor substrate; and etching said polysilicon layer with a fourth flow of helium and chlorine gases into the plasma reactive etching chamber containing said semiconductor substrate to thereby etch and pattern portions of the polysilicon layer forming the polysilicon gate.

2. The process of claim 1 wherein said substrate is a silicon wafer having an overlying oxide layer with a thickness of approximately 100 Å.

3. The process of claim 1 wherein during the first flow of fluoride and helium gases the flow rate of the fluorine gas is between about 170 to 180 sccm and the flow rate of the helium gas is between about 145 to 155 sccm.

4. The process of claim 1 wherein during the first flow of fluorine and helium gases the radio frequency power applied is about 325 watts.

5. The process of claim 1 wherein said etch chamber is a vacuum chamber and the vacuum chamber during said first flow of fluorine and helium gases has a vacuum of about 600 mTorr and a temperature of about 120° C.

6. The process of claim 1 wherein during the second flow of chlorine and helium gases the flow rate of the chlorine gas is between about 125 to 135 sccm and the flow rate of the helium gas is between about 65 to 75 sccm.

7. The process of claim 1 wherein during the second flow of chlorine and helium gases the radio frequency power applied is about 200 watts.

8. The process of claim 1 wherein said etch chamber is a vacuum chamber and the vacuum chamber during said second flow of chlorine and helium gases has a vacuum of about 200 mTorr and a temperature of about 120° C.

9. The process of claim 1 wherein during the third flow of fluoride and helium gases the flow rate of the chlorine gas is between about 95 to 105 sccm and the flow rate of the helium gas is between about 95 to 105 sccm.

10. The process of claim 1 wherein during the third flow of fluorine and helium gases the radio frequency power applied is about 225 watts.

11. The process of claim 1 wherein said etch chamber is a vacuum chamber and the vacuum chamber during said third flow of fluorine and helium gases has a vacuum of about 900 mTorr and a temperature of about 120° C.

12. The process of claim 1 wherein during the third flow of fluorine and helium gases said fluorine gas is a gas selected from the group consisting of $C_2F_6$, and $CF_4$.

13. The process of claim 1 wherein during the fourth flow of chlorine and helium gases the flow rate of the chlorine gas is between about 125 to 135 sccm and the flow rate of the helium gas is between about 65 to 75 sccm.

14. The process of claim 1 wherein during the fourth flow of chlorine and helium gases the radio frequency power applied is about 200 watts.

15. The process of claim 1 wherein said etch chamber is a vacuum chamber and the vacuum chamber during said fourth flow of chlorine and helium gases has a vacuum of about 200 mTorr and a temperature of about 120° C.

16. The process of etching a polysilicon gate from a polysilicon layer on a suitable substrate through a patterned resist layer that exposes portions of the polysilicon layer in a plasma reactive etch chamber which minimizes undercutting of the polysilicon layer, which process comprises:

etching said polysilicon layer so to remove the majority of the exposed polysilicon layer;

etching said polysilicon layer with a passivation formation etch step with the use of an etch gas comprising a mixture of fluorine containing gas and helium gases in the plasma reactive etching chamber containing said semiconductor wafer; and etching said polysilicon layer with an overetch step with the use of an etch gas comprising helium and chlorine gases in the plasma reactive etching chamber containing said semiconductor wafer.

17. The process of claim 16 wherein said substrate is a silicon wafer having an overlying native oxide layer with a thickness of approximately 100 Å.

18. The process of claim 16 wherein during the passivation formation etch step the flow rate of the fluorine gas is between about 95 to 105 sccm and the flow rate of the helium gas is between about 95 to 105 sccm.

19. The process of claim 16 wherein during the passivation formation etch step the radio frequency power applied is about 225 watts.

20. The process of claim 16 wherein said etch chamber is a vacuum chamber and the vacuum chamber during said passivation formation etch step has a vacuum of about 900 mTorr and a temperature of about 120° C.

21. The process of claim 16 wherein during the passivation formation etch step said fluorine gas is a gas selected from the group consisting of $C_2F_6$, and $CF_4$.

22. The process of claim 16 wherein during the overetch step the flow rate of the chlorine gas is between about 125 to 135 sccm and the flow rate of the helium gas is between about 65 to 75 sccm.

23. The process of claim 16 wherein during the overetch step the radio frequency power applied is about 200 watts.

24. The process of claim 16 wherein said etch chamber is a vacuum chamber and the vacuum chamber during said overetch step has a vacuum of about 200 mTorr and a temperature of about 120° C.

* * * * *